(12) United States Patent
Liu et al.

(10) Patent No.: US 10,416,730 B2
(45) Date of Patent: Sep. 17, 2019

(54) RECIPROCATING DRIVING DEVICE IN LOAD-TESTING AND SLIDING RAIL TESTING SYSTEM USING THE SAME

(71) Applicant: HONGFUJIN PRECISION ELECTRONICS (TIANJIN) CO., LTD., Tianjin (CN)

(72) Inventors: Feng-Kui Liu, Tianjin (CN); Fang-Xing Yang, Tianjin (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 223 days.

(21) Appl. No.: 15/686,777

(22) Filed: Aug. 25, 2017

(65) Prior Publication Data

US 2018/0364772 A1 Dec. 20, 2018

(30) Foreign Application Priority Data

Jun. 14, 2017 (CN) .......................... 2017 1 0449623

(51) Int. Cl.
| | |
|---|---|
| *G01M 15/00* | (2006.01) |
| *G06F 1/18* | (2006.01) |
| *G01L 5/00* | (2006.01) |
| *H05K 7/14* | (2006.01) |

(52) U.S. Cl.
CPC ............ *G06F 1/187* (2013.01); *G01L 5/0028* (2013.01); *H05K 7/1489* (2013.01)

(58) Field of Classification Search
USPC ...................................................... 73/118.01
See application file for complete search history.

(56) References Cited

U.S. PATENT DOCUMENTS

| | | | |
|---|---|---|---|
| 6,415,876 B1 * | 7/2002 | Bollinger ............... | B23D 51/18 173/135 |
| 2004/0017170 A1 * | 1/2004 | Endo ..................... | G05B 19/416 318/272 |
| 2004/0062657 A1 * | 4/2004 | Beck ...................... | E21B 43/126 417/42 |
| 2004/0073195 A1 * | 4/2004 | Cucin ............... | A61B 17/32002 604/542 |
| 2007/0272179 A1 * | 11/2007 | Luercho .................. | F01L 3/085 123/90.11 |
| 2009/0053800 A1 * | 2/2009 | Friend .................... | C12M 45/02 435/289.1 |
| 2011/0101833 A1 * | 5/2011 | Olesiewicz ............ | H05K 7/183 312/223.2 |
| 2013/0001031 A1 * | 1/2013 | Froschle ............... | F15B 15/204 188/322.15 |
| 2014/0265786 A1 * | 9/2014 | Chen .................... | H05K 7/1489 312/334.1 |

(Continued)

*Primary Examiner* — Rodney E Fuller
(74) *Attorney, Agent, or Firm* — ScienBiziP, P.C.

(57) ABSTRACT

A system for testing load-bearing and durability of a sliding rail includes a chassis, a sliding rail mounted on the chassis, a sliding member installed on the sliding rail, and a reciprocating driving device. The reciprocating driving device includes a control unit, a reversing unit, and a driving unit connected to the reversing unit. The driving unit drives the sliding member and the control unit outputs control signals to the reversing unit to periodically reverse driving direction of the driving unit, according to the control signals. The reciprocating driving device is also disclosed.

18 Claims, 3 Drawing Sheets

(56) References Cited

U.S. PATENT DOCUMENTS

2017/0275947 A1* 9/2017 Morissette .............. E21B 7/025
2017/0303426 A1* 10/2017 Chen ...................... A47B 96/07
2019/0039680 A1* 2/2019 Angell ................... B62K 25/04

* cited by examiner

RECIPROCATING DRIVING DEVICE IN LOAD-TESTING AND SLIDING RAIL TESTING SYSTEM USING THE SAME

FIELD

The subject matter herein generally relates to a reciprocating driving device and sliding rail testing systems using the reciprocating driving device.

BACKGROUND

As the demand for data storage has increased, storage servers stored in data center cabinets have become more densely packed. A data center typically includes multiple server units (e.g., blade server units) in a chassis. The server units are slid into or out of the chassis through sliding rails.

A server unit can be quite heavy. This poses challenge to the steadiness and durability of the sliding rail. Testing of such rails in a fully extended position with weight applied is required. There is a need for a solution to test the sliding rail before the sliding rail is put into use.

BRIEF DESCRIPTION OF THE DRAWINGS

Implementations of the present technology will now be described, by way of example only, with reference to the attached figures.

DETAILED DESCRIPTION

Figure 1:
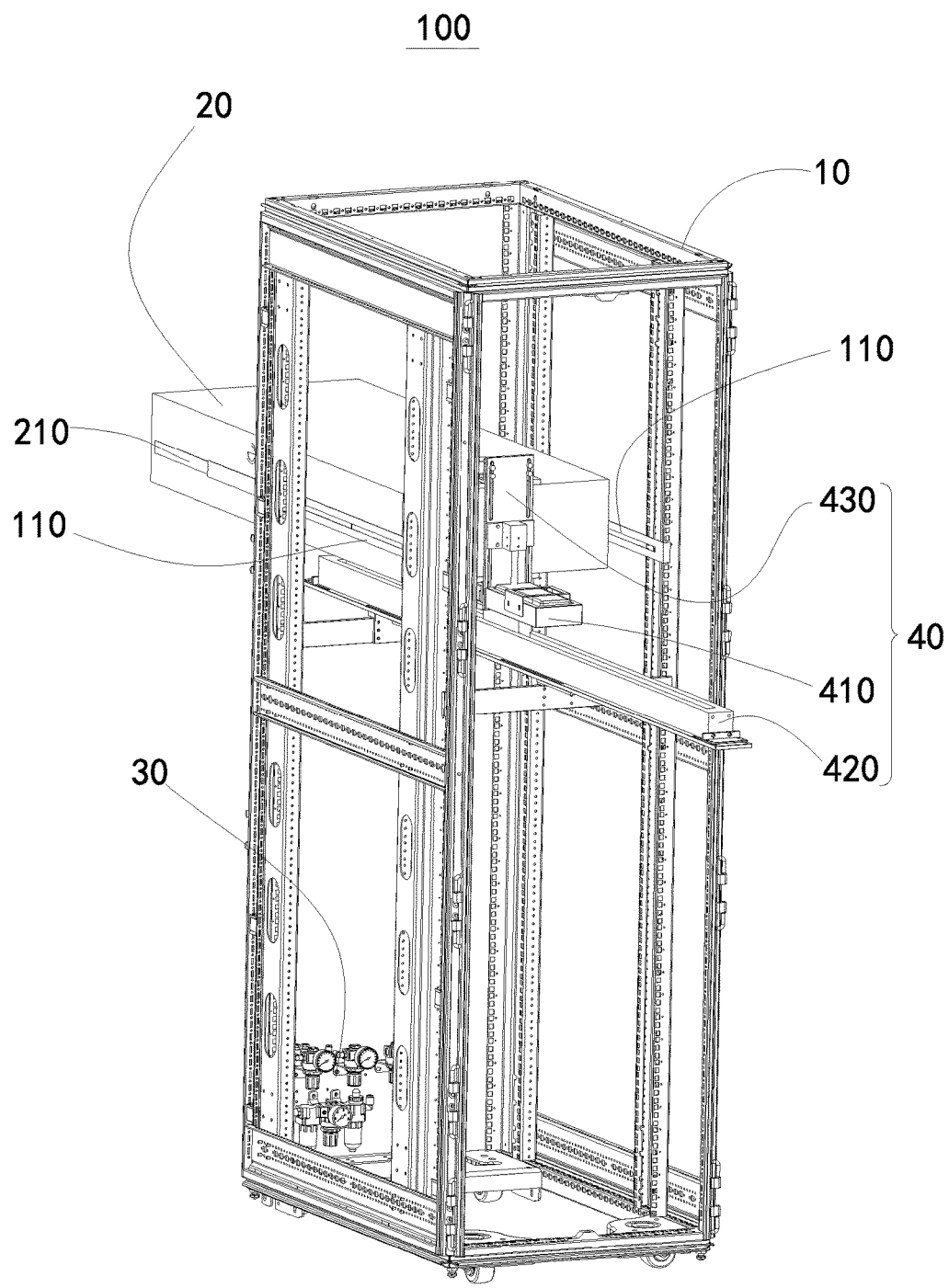
FIG. 1 is an isometric view of an exemplary embodiment of a sliding rail testing system.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 2:
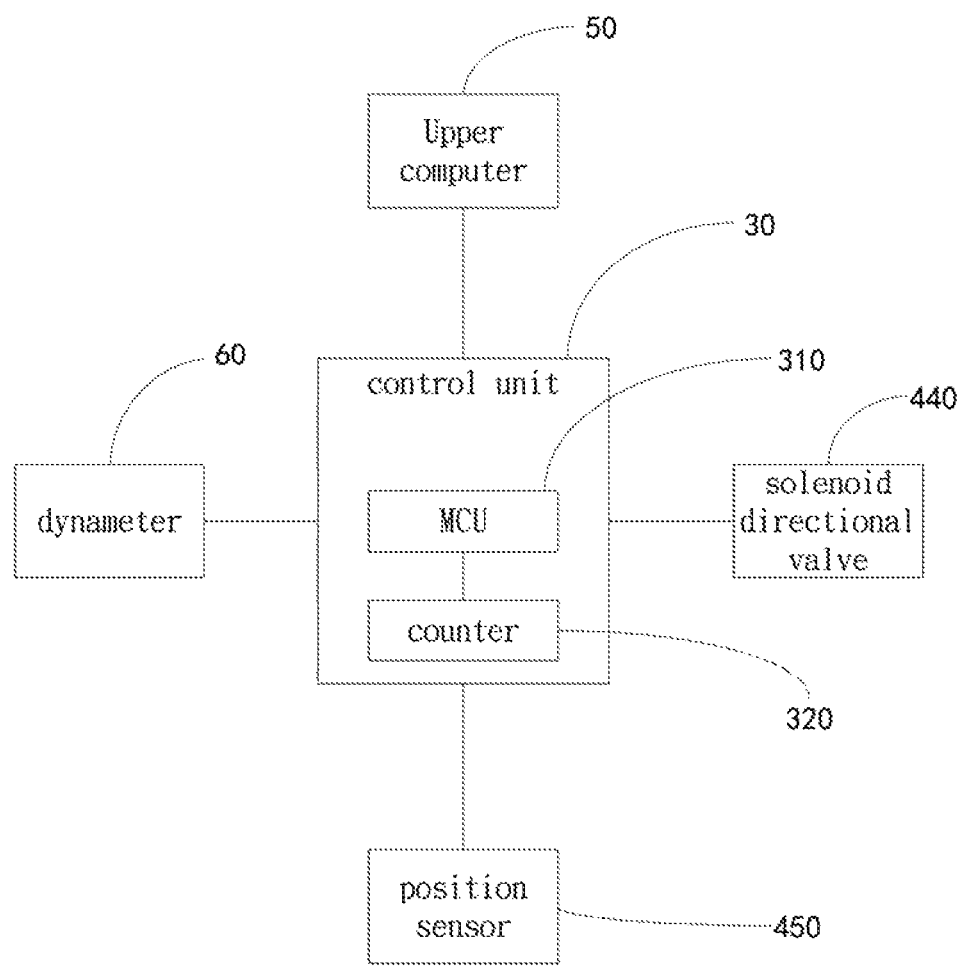
FIG. 2 is a diagram of a control unit of the sliding rail testing system of FIG. 1.
Figure 3:
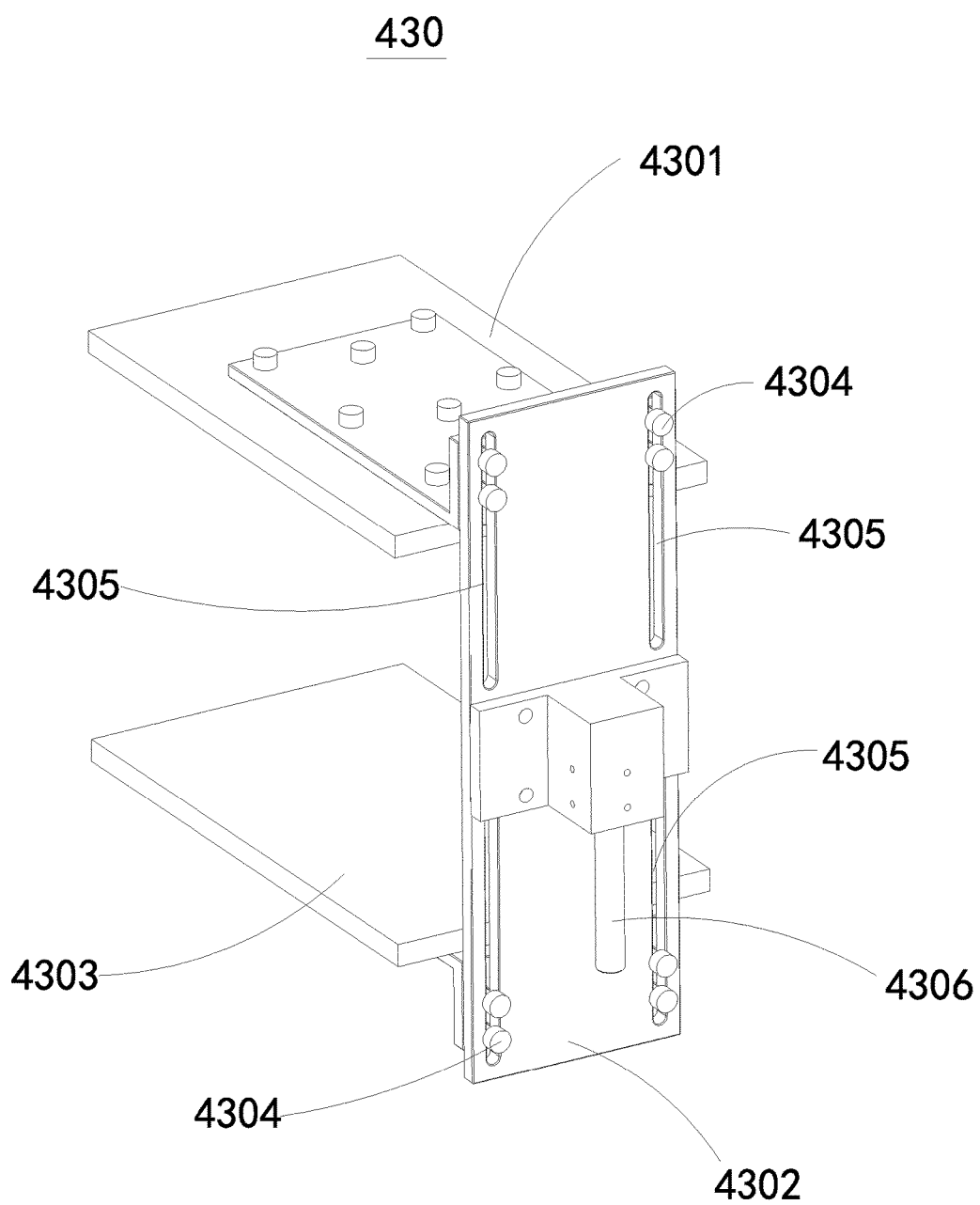
FIG. 3 is an isometric view of a clamping unit of the of the sliding rail testing system of FIG. 1.

FIGS. 1 to 3 illustrate a sliding rail testing system 100 in an exemplary embodiment.

The sliding rail testing system 100 can include a chassis 10, two sliding rails 110 installed on the chassis 10, a sliding member 20 slidably installed on the sliding rails 110, and a reciprocating driving device 40. The sliding member 20 can define two sliding portions 210, and the sliding member 20 can be slidably installed on the sliding rails 110 through the two sliding portions 210.

The reciprocating driving device 40 can include a control unit 30, a reversing unit 440 (e.g., a solenoid directional valve), and a driving unit 410. The reversing unit 440 communicates with the control unit 30. The driving unit 410 is connected to the reversing unit 440.

The driving unit 410 drives the sliding member 20. The control unit 30 outputs control signals to the reversing unit 440, and the reversing unit 440 periodically reverses a driving direction of the driving unit 410 according to the control signals.

The driving unit 410 can be an air cylinder. The reversing unit 440 can be an electrically-operated directional valve (e.g., a solenoid directional valve). The control unit 30 controls the driving direction of the air cylinder through the directional valve.

In at least one exemplary embodiment, the sliding rail testing system 100 can further include a clamping unit 430. The clamping unit 430 is connected between the driving unit 410 and the sliding member 20, so that the sliding member 20 can be driven by the driving unit 410.

As shown in FIG. 3, the clamping unit 430 can include an upper clamping plate 4301, a connecting plate 4302, and a lower clamping plate 4303.

The upper clamping plate 4301 is parallel to the lower clamping plate 4303. The upper clamping plate 4101 and the lower clamping plate 4303 are respectively and perpendicularly connected to two ends of the connecting plate 4302. The driving unit 410 is connected to the connecting plate 4302, the sliding member 20 is clamped between the upper clamping plate 4301 and the lower clamping plate 4302. For example, the connecting plate 4302 defines a connecting portion 4306, and the connecting plate 4302 is connected to the driving unit 410 through the connecting portion 4306.

Each of the upper clamping plate 4301 and the lower clamping plate 4303 defines a sliding portion (not shown) and a screw hole on the sliding portion. The connecting plate 4302 defines sliding slots 4305 corresponding to the sliding portions.

Each sliding portion is received in a sliding slot 4305, and the sliding portion is fastened to the connecting plate 4302 by a screw.

In at least one exemplary embodiment, the sliding rail testing system 100 can further include a dynamometer 60 (as shown in FIG. 2) connected to the driving unit 410. The dynamometer 60 communicates with the control unit 30, and measures the driving force of the driving unit 410. A quantitative value of the driving force of the driving unit 410 can be sent to the control unit 410.

In at least one exemplary embodiment, the reciprocating driving device 40 can further include a air cylinder 420 and two position sensors (not shown). The two position sensors are connected to the air cylinder 420 and communicate with the control unit 30.

The two position sensors 450 are distributed at predetermined positions of the driving unit 410, so that when the sliding member 20 is driven to a predetermined position, the position of the sliding member 20 can be sent to the control unit 30 by the two position sensors 450. The control unit 30 outputs a control signal to the reversing unit 440, and the reversing unit 440 then reverses a driving direction of the driving unit 410.

The two position sensors can be slidably connected to the air cylinder 420 and locked by a locking member (not shown), so that reversing positions of the driving unit 410 can be adjusted.

The control unit 30 can further include a counter 320, the counter 320 can record number of reversals in driving direction of the driving unit 410. When the number of reversals is up to a predetermined value, the control unit 30 can control the driving unit 410 to shut down.

The sliding rail testing system 100 can further include an upper computer 50, the upper computer 50 communicates with the control unit 30.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A reciprocating driving device comprising:
   a control unit;
   a reversing unit communicating with the control unit; and
   a driving unit connected to the reversing unit;
   wherein the control unit outputs control signals to the reversing unit, and the reversing unit periodically reverses a driving direction of the driving unit according to the control signals; and
   wherein the reciprocating driving device further comprises a dynamometer connected to the driving unit; the dynamometer communicates with the control unit; the dynamometer measures driving force of the driving unit and sends a quantitative value to the control unit.

2. The reciprocating driving device of claim 1, wherein the driving unit is an air cylinder; and the reversing unit is an electromagnetic directional valve; the control unit controls to change the driving direction of the air cylinder through the electromagnetic directional valve.

3. The reciprocating driving device of claim 2, wherein the reciprocating driving device further comprises:
   an air cylinder; and
   two position sensors connected to the air cylinder and communicate with the control unit;
   the two position sensors are distributed on two predetermined reversing positions of the driving unit.

4. The reciprocating driving device of claim 3, wherein the two position sensors are slidably connected to the air cylinder and locked by a locking member.

5. The reciprocating driving device of claim 1, wherein the reciprocating driving device further comprises a clamping unit connected to the driving unit.

6. The reciprocating driving device of claim 5, wherein the clamping unit comprises:
   an upper clamping plate;
   a connecting plate; and
   a lower clamping plate;
   wherein the upper clamping plate is parallel to the lower clamping plate, the upper clamping plate and the lower clamping plate are respectively and perpendicularly connected to two ends of the connecting plate.

7. The reciprocating driving device of claim 6, wherein each of the upper clamping plate and the lower clamping plate defines a sliding portion and a screw hole on the sliding portion; the connecting plate defines sliding slots corresponding to the sliding portions;
   each sliding portion is received in a corresponding sliding slot and fastened to the connecting plate by a screw.

8. The reciprocating driving device of claim 1, wherein the control unit comprises a counter recording reverse times of the driving direction of the driving unit.

9. The reciprocating driving device of claim 1, wherein the reciprocating driving device further comprises an upper computer communicating with the control unit.

10. A sliding rail testing system comprising:
    a chassis;
    a sliding rail mounted on the chassis;
    a sliding member installed on the sliding rail; and
    a reciprocating driving device comprising:
      a control unit;
      a reversing unit communicating with the control unit; and
      a driving unit connected to the reversing unit;
    wherein the driving unit is drivingly connected to the sliding member; the control unit outputs control signals to the reversing unit, and the reversing unit periodically reverses a driving direction of the driving unit according to the control signals; and
    wherein the sliding rail testing system further comprises a dynamometer connected to the driving unit; the dynamometer communicates with the control unit; the dynamometer measures driving force of the driving unit and sends a quantitative value to the control unit.

11. The sliding rail testing system of claim 10, wherein the driving unit is an air cylinder; and the reversing unit is an electromagnetic directional valve; the control unit controls to change the driving direction of the air cylinder through the electromagnetic directional valve.

12. The sliding rail testing system of claim 11, wherein the sliding rail testing system further comprises:
    an air cylinder; and
    two position sensors connected to the air cylinder and communicate with the control unit;
    the two position sensors are distributed on two predetermined reversing positions of the driving unit.

13. The sliding rail testing system of claim 12, wherein the two position sensors are slidably connected to the air cylinder and locked by a locking member.

14. The sliding rail testing system of claim 10, wherein the sliding rail testing system further comprises a clamping unit connected to the driving unit.

15. The sliding rail testing system of claim 14, wherein the clamping unit comprises:
    an upper clamping plate;
    a connecting plate; and
    a lower clamping plate;
    wherein the upper clamping plate is parallel to the lower clamping plate, the upper clamping plate and the lower clamping plate are respectively and perpendicularly connected to two ends of the connecting plate; the driving unit is clamped between the upper clamping plate and the lower clamping plate.

16. The sliding rail testing system of claim 15, wherein each of the upper clamping plate and the lower clamping plate defines a sliding portion and a screw hole on the sliding portion; the connecting plate defines sliding slots corresponding to the sliding portions;

each sliding portion is received in a corresponding sliding slot and fastened to the connecting plate by a screw.

17. The sliding rail testing system of claim 10, wherein the control unit comprises a counter recording reverse times of the driving direction of the driving unit.

18. The sliding rail testing system of claim 10, wherein the sliding rail testing system further comprises an upper computer communicating with the control unit.

* * * * *